(12) United States Patent
Nagara et al.

(10) Patent No.: US 7,329,984 B2
(45) Date of Patent: Feb. 12, 2008

(54) ORGANIC EL DEVICES

(75) Inventors: Yoshiaki Nagara, Aichi-ken (JP);
Toshiki Iijima, Aichi-ken (JP);
Kazuhito Kawasumi, Aichi-ken (JP)

(73) Assignee: Kabushiki Kaisha Toyota Jidoshokki, Kariya-shi (JP)

( * ) Notice: Subject to any disclaimer, the term of this patent is extended or adjusted under 35 U.S.C. 154(b) by 261 days.

(21) Appl. No.: 11/301,848

(22) Filed: Dec. 12, 2005

(65) Prior Publication Data

US 2006/0125380 A1 Jun. 15, 2006

(30) Foreign Application Priority Data

Dec. 13, 2004 (JP) .......................... 2004-360420

(51) Int. Cl.
*H01J 1/62* (2006.01)
(52) U.S. Cl. ..................... 313/506; 313/504
(58) Field of Classification Search ......... 313/504–506
See application file for complete search history.

(56) References Cited

U.S. PATENT DOCUMENTS

2002/0125818 A1   9/2002   Sato et al. ................. 313/504
2004/0124766 A1   7/2004   Nakagawa et al. ......... 313/504
2004/0169461 A1   9/2004   Moriyama et al. .......... 313/503

FOREIGN PATENT DOCUMENTS

| JP | 2001-284056 | 10/2001 |
| JP | 2002-525808 | 8/2002 |
| JP | 2003-077674 | 3/2003 |
| JP | 2003-526876 | 9/2003 |
| JP | 2004-014155 | 1/2004 |
| JP | 2004-227814 | 8/2004 |
| KR | 2004-0014353 | 2/2004 |
| KR | 2004-82286 | 9/2004 |
| WO | WO 02/091814 | 11/2002 |

OTHER PUBLICATIONS

Korean Office Action dated Dec. 5, 2006 for Korean Patent Application No. 2005-0121568.

*Primary Examiner*—Vip Patel
(74) *Attorney, Agent, or Firm*—Morgan & Finnegan, L.L.P.

(57) ABSTRACT

Organic EL devices having a light-emitting layer having a fluorescent dopant, a light-emitting layer having a phosphorescent dopant, and a non-light-emitting interface layer provided between an anode and a cathode wherein the light-emitting layer having a fluorescent dopant is provided nearer to the cathode than the light-emitting layer having a phosphorescent dopant and wherein the non-light-emitting interface layer is provided between the light-emitting layer having a fluorescent dopant and the light-emitting layer comprising a phosphorescent dopant.

12 Claims, 1 Drawing Sheet

ORGANIC EL DEVICES

FIELD OF THE INVENTION

The present invention relates to organic electroluminescence (EL) devices.

BACKGROUND OF THE INVENTION

Recently, there are great expectations towards applications of organic EL devices in full-color display devices. As one method for full-color displays using an organic EL device, a method is known where white light emitted by the device is divided into red, green, and blue lights by color filters and the following properties are required in organic EL devices used for such purposes:
i) Good balance amongst the light-emitting intensities of red, green, and blue and a resulting good whiteness;
ii) High light-emitting efficiency;
iii) Long lifetime.

As an organic EL device whose above properties are relatively good one has been proposed wherein a blue fluorescent dopant, a red phosphorescent dopant, and a green phosphorescent dopant are contained in the same light-emitting layer, for example, as seen in JP2004-14155A.

In such organic EL devices, however, the triplet energy of the red or green phosphorescent dopant moves to the triplet energy of the blue fluorescent dopant if the latter is lower than the former. In general, if a fluorescent material is brought into its triplet excited state, its energy is not used for emitting light but is consumed as heat. Thus, the blue fluorescent dopants in their triplet excited state do not emit light and are heat-deactivated. Such organic EL devices cannot achieve highly efficient light-emission or good whiteness.

An organic EL device has been proposed wherein a phosphorescent or fluorescent light-emitting dopant whose maximum-light-emission wave length is longer than that of another phosphorescent light-emitting dopant and this dopant are contained in the same light-emitting layer in, for example, JP2003-77674A.

However, in order to obtain organic EL devices whose whiteness is good, it is in fact preferred that the peak of blue be set as the maximum-light-emission wave length, so JP2003-77674A cannot achieve good whiteness. Further, since blue phosphorescent dopants have an extremely short lifetime, there is a problem in that they cannot be practically supplied.

Further, an organic EL device wherein an iridium (Ir) complex as a phosphorescent dopant is contained in a light-emitting layer has been proposed, for example, in JP2003-526876T.

This organic EL device can improve light-emission efficiency of a single color such as green, etc. but cannot improve balance amongst the light-emission intensities of red, green, and blue to achieve good whiteness.

SUMMARY OF THE INVENTION

As noted above, no organic EL device has been obtained yet which simultaneously has good whiteness, light-emitting efficiency, and lifetime. Considering the above problems, the present invention is aimed at providing organic EL devices which simultaneously have good whiteness, light-emitting efficiency, and lifetime.

The present inventors as a result of industriously conducting research and development in order to solve the above conventional problems conceived of the idea that it is effective to provide a non-light-emitting interface layer between a light-emitting layer comprising a fluorescent dopant and a light-emitting layer comprising a phosphorescent dopant and further to provide the light-emitting layer comprising a fluorescent dopant nearer to the cathode than the light-emitting layer comprising a phosphorescent dopant, to complete the present invention.

The present organic EL device is an organic EL device wherein a light-emitting layer comprising a fluorescent dopant, a light-emitting layer comprising a phosphorescent dopant, and a non-light-emitting interface layer are provided between its anode and cathode, the light-emitting layer comprising a fluorescent dopant is provided nearer to the cathode than the light-emitting layer comprising a phosphorescent dopant, and the non-light-emitting interface layer is provided between the light-emitting layer comprising a fluorescent dopant and the light-emitting layer comprising a phosphorescent dopant.

The fluorescent dopant is preferably a blue fluorescent dopant and the phosphorescent dopant is preferably at least one selected from a red phosphorescent dopant and a green phosphorescent dopant.

The light-emitting layer comprising a phosphorescent dopant preferably comprises a red phosphorescent dopant, and in this case, a green phosphorescent dopant wherein the weight % concentration of the red phosphorescent dopant is preferably lower than that of the green phosphorescent dopant.

Also, it is preferred that the red phosphorescent dopant and the green phosphorescent dopant are comprised in different light-emitting layers wherein the weight % concentration of the red phosphorescent dopant is preferably lower than that of the green phosphorescent dopant. Further, the light-emitting layer comprising a red phosphorescent dopant is preferably provided nearer to the anode than the light-emitting layer comprising a green phosphorescent dopant and the light-emitting layer comprising a red phosphorescent dopant preferably forms an island thin film.

Moreover, it is preferred that the thickness of the light-emitting layer comprising a fluorescent dopant is thicker than that of the light-emitting layer comprising a phosphorescent dopant.

A hole-blocking layer may be further provided on the cathode side of the light-emitting layer comprising a fluorescent dopant.

DESCRIPTION OF THE PREFERRED EMBODIMENTS

Figure 1:
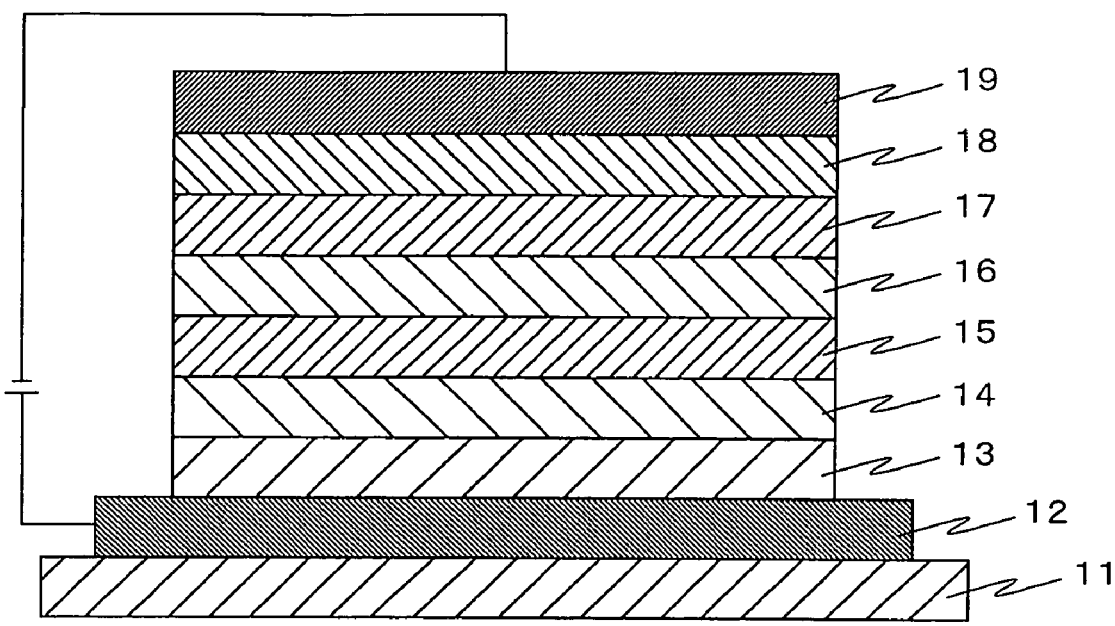
FIG. 1 is a cross sectional figure to set forth a layer construction example of the present organic EL device.

<<Layer Constructions of the Present Organic EL Device>>

The present organic EL device is an organic EL device having a light-emitting layer comprising a fluorescent dopant and a light-emitting layer comprising a phosphorescent dopant provided between its anode and cathode wherein the light-emitting layer comprising a fluorescent dopant is provided nearer to the cathode than the light-emitting layer comprising a phosphorescent dopant and wherein a non-light-emitting interface layer is provided between the light-emitting layer comprising a fluorescent dopant, hereinafter referred to as "fluorescent light-emitting layer", and the light-emitting layer comprising a phosphorescent dopant, hereinafter referred to as "phosphorescent light-emitting layer". That is, the layer construction is as shown below:

i) anode/phosphorescent light-emitting layer/non-light-emitting interface layer/fluorescent light-emitting layer/cathode Hereinafter, a phosphorescent light-emitting layer/non-light-emitting interface layer/fluorescent light-emitting layer set may be called a "light-emitting band".

Based upon this layer construction, other layers as in known organic EL devices may be provided. In more detail, for example, the following layer constructions are possible.

ii) anode/hole-transporting layer/phosphorescent light-emitting layer/non-light-emitting interface layer/fluorescent light-emitting layer/electron-transporting layer/electron-injecting layer/cathode (FIG. 1)

iii) anode/hole-transporting layer/phosphorescent light-emitting layer/non-light-emitting interface layer/fluorescent light-emitting layer/hole-blocking layer/electron-transporting layer/electron-injecting layer/cathode iv) anode/phosphorescent light-emitting layer/non-light-emitting interface layer/fluorescent light-emitting layer/electron-transporting layer/electron-injecting layer/cathode v) anode/phosphorescent light-emitting layer/non-light-emitting interface layer/fluorescent light-emitting layer/hole-blocking layer/electron-transporting layer/electron-injecting layer/cathode As noted above, it is possible that the hole-transporting layer and so on are omitted, by the phosphorescent light-emitting layer having a hole-injecting function and a hole-transporting function. If layers are omitted in this way, the number of layers is decreased and it leads to cost reduction. Another layer with a hole-injecting function, which is called "a hole-injecting layer", may be provided between the anode and the hole-transporting layer. The hole-injecting layer gives the following properties to the present organic EL device.

i) A lower driving voltage.
ii) Stabilization of injection of holes from the anode into the hole-transporting layer resulting in a longer lifetime of the present organic EL devices.
iii) An improved adhesion between the anode and the hole-transporting layer resulting in a more uniform light-emitting surface.
iv) Coating of projections, etc. on the anode resulting in reduced defects of the present organic EL devices.

Materials used for the hole-injecting layer can be any giving the above properties to the hole-injecting layer and known materials can be used as they are. The hole-injecting layer may be formed with only one of or a plurality of such materials. The thickness of the hole-injecting layer is 0.1 nm-100 nm, preferably 0.3 nm-50 nm.

Such layers may have functions other than their original function. For example, the light-emitting layers, which are the phosphorescent light-emitting layer and the fluorescent light-emitting layer, may also have a hole-injecting function, a hole-transporting function, an electron-injecting function, and/or an electron-transporting function.

Further, layers other than the above can also be suitably provided.

Herein, an organic EL device (10) will be set forth in detail with reference to FIG. 1. The organic EL device (10) is produced by sequentially laminating an anode (12), a hole-transporting layer (13), a phosphorescent light-emitting layer (14), a non-light-emitting interface layer (15), a fluorescent light-emitting layer (16), an electron-transporting layer (17), an electron-injecting layer (18), and a cathode (19) on a substrate (11). Naturally, the substrate (11) can be located on the cathode (19) side not on the anode (12) side.

<<Substrate (11)>>

The substrate (11) is usually in a plate form to support the present organic EL devices. In general, organic EL devices consist of very thin layers and thus are prepared on the support of such a substrate.

In order to support such organic EL devices, it is preferable that the substrate (11) is flat and smooth.

In cases where the substrate (11) is located on the light-emitting surface side with respect to the light-emitting band, the substrate (11) should be transparent to light to be emitted.

Any known substrates can be used as the substrate (11) if they have the above properties. In general, ceramic substrates such as glass substrates, silicon substrates, quartz substrates, etc. and plastic substrates are selected. Metal substrates, substrates with a metal foil formed on a support, etc. may also be used. Further, composite substrates consisting of a combination of a plurality of identical or different substrates can also be used.

<<Anode (12)>>

The anode (12) is then formed on the substrate (11).

The anode (12) is an electrode to inject holes into the hole-transporting layer (13). Materials for formation of the anode (12) may thus be any material that gives this property to the anode (12). In general, known materials such as metals, alloys, electrically conductive compounds, mixtures thereof, etc. are selected.

Materials for formation of the anode (12) include for example the following:

metal oxides such as indium tin oxide (ITO), indium zinc oxide (IZO), tin oxide (SnO), zinc oxide (ZnO), zinc aluminum oxide ($Al_2ZnO_4$), etc.;

metal nitrides such as titanium nitride, etc.;

metals such as gold, platinum, silver, copper, aluminum, nickel, cobalt, lead, chromium, molybdenum, tungsten, tantalum, niobium, etc., alloys thereof, alloys of copper iodides, etc.;

conductive organic polymers such as polyanilines, polythiophenes, polypyrroles, polyphenylenevinylenes, poly(3-methylthiophene), polyphenylenesulphides, etc.

In cases where the anode (12) is located on the light-emitting surface side with respect to the light-emitting band, transparency of the anode (12) to light to be emitted should in general be greater than 10%. In cases where visible light is emitted, ITO is preferably used whose transparency is high to visible light.

In cases where the anode (12) is used as a reflective electrode, materials reflective to light to be emitted are suitably selected from the above materials. In general, metals, alloys, metal compounds, etc. are selected.

The anode (12) may be formed with only one kind of or a mixture of a plurality of the above mentioned materials. Further, the anode (12) may also have a plurality of layers consisting of identical or different composition(s).

After selection of the above materials, it is preferable that an auxiliary electrode be provided to lower resistance of the anode (12) if the resistance is large. The auxiliary electrode is made of a metal such as silver, copper, chromium, aluminum, titanium, aluminum alloys, etc. or of a lamination thereof and is partially provided with the anode (12).

The anode (12) is formed with the above mentioned material(s) by a known thin film-forming method such as sputtering methods, ion-plating methods, vacuum-vapordeposition methods, spin-coating methods, electron-beam vapor-deposition methods, etc. on the substrate (11).

It is preferable to clean the surface of the anode (12) with UV ozone, oxygen-plasma, etc. In order to reduce defects such as shorts, etc., it is preferable to reduce the square mean value of the surface roughness of the anode (12) to 20 nm or less for example by polishing of the surface after formation of the anode (12).

Although depending upon the materials used, the thickness of the anode (12) is in general set to be around 5 nm-1 μm, preferably around 10 nm-1 μm, more preferably around 10 nm-500 nm, in particular preferably around 10 nm-300 nm, and most desirably in the range of 10 nm-200 nm.

Electric resistance per sheet of the anode (12) is preferably set to be several hundred Ω/sheet or less, more preferably to be around 5-50 Ω/sheet.

<<Hole-Transporting Layer (13)>>

The hole-transporting layer (13) is then formed on the anode (12).

The hole-transporting layer (13) is provided between the anode (12) and the phosphorescent light-emitting layer (14). The hole-transporting layer (13) transports holes injected from the anode (12) to the phosphorescent light-emitting layer (14).

Materials capable of being used for the hole-transporting layer (13) can be any giving the above properties to the hole-transporting layer (13). Any can be used selected from known materials capable of being used as a hole-transporting material, materials with a high hole-transporting property, known materials used in hole-transporting layers of organic EL devices, etc.

Examples of such materials include phthalocyanine derivatives, triazole derivatives, triarylmethane derivatives, triarylamine derivatives (=aromatic tertiary amine compounds), oxazole derivatives, oxadiazole derivatives, hydrazone derivatives, stilbene derivatives, pyrazoline derivatives, polysilane derivatives, imidazole derivatives, phenylenediamine derivatives, amino-substituted chalcone derivatives, styryl compounds such as styrylanthracene derivatives, styrylamine derivatives, etc., fluorene derivatives, silazane derivatives, carbazole derivatives, anilino-copolymers, porphyrin compounds, polyarylalkane derivatives, polyphenylenevinylene derivatives, polythiophene derivatives, poly-N-vinylcarbazole derivatives, conductive oligomers such as thiophene oligomers, etc., styrylamine compounds, tetraamines, benzidines, arylenediamine derivatives, para-phenylenediamine derivatives, meta-phenylenediamine derivatives, etc. In particular, there are dimers of triarylamine, trimers of triarylamine, tetramers of triarylamine, pentamers of triarylamine, 1,1-bis(4-diarylaminophenyl)cyclohexanes, 4,4'-di(diarylamino)biphenyls, bis[4-(diarylamino)phenyl]methanes, 4,4''-di(diarylamino)terphenyls, 4,4'''-di(diarylamino)quaterphenyls, 4,4'-di(diarylamino)diphenyl ethers, 4,4'-di(diarylamino)diphenylsulphanes, bis [4-(diarylamino)phenyl]dimethylmethanes, bis [4-(diarylamino)phenyl]-di(trifluoromethyl)methanes, 2,2-diphenylvinyl compounds, aromatic dimethylidene compounds, etc.

Amongst these, as triarylamine derivatives (=aromatic tertiary amine compounds) and styrylamine compounds, for example, dimers of triphenylamine, trimers of triphenylamine, tetramers of triphenylamine, pentamers of triphenylamine, 4,4'-bis [N-phenyl-N-(4''-methylphenyl)amino]biphenyl, 4,4'-bis[N-phenyl-N-(3''-methylphenyl)amino] biphenyl, 4,4'-bis[N-phenyl-N-(3''-methoxyphenyl)amino] biphenyl, N,N'-diphenyl-N,N'-bis(1-naphthyl)-(1,1'-biphenyl)-4,4'-diamine (NPB), 3,3'-dimethyl-4,4'-bis[N-phenyl-N-(3''-methylphenyl)amino]biphenyl, 1,1-bis[4'-[N,N-di(4''-methylphenyl)amino]phenyl]cyclohexane, 9,10-bis [N-(4'-methylphenyl)-N-(4''-n-butylphenyl)amino] phenanthrene, 3,8-bis(N,N-diphenylamino)-6-phenylphenanthridine, 4-methyl-N,N-bis[4'',4'''-bis[N',N''-di(4-methylphenyl)amino]biphenyl-4-yl]-aniline, N,N''-bis [4-(diphenylamino)phenyl]-N,N'-diphenyl-1,3-diaminobenzene, N,N'-bis [4-(diphenylamino)phenyl]-N,N'-diphenyl-1,4-diaminobenzene, 5,5''-bis[4-bis(4-methylphenyl)aminophenyl]-2,2':5',2''-terthiophene, 1,3,5-tris(diphenylamino) benzene, 4,4',4''-tris(N-carbazolyl)triphenylamine, 4,4',4''-tris [N-(3'''-methylphenyl)-N-phenylamino]triphenylamine, 4,4',4''-tris[N,N-bis(4'''-tert-butylbiphen-4'''-yl)amino]triphenylamine, 1,3,5-tris[N-(4'-diphenylaminophenyl)-N-phenylamino]benzene, N,N,N',N'-tetraphenyl-4,4'-diaminobiphenyl, N,N'-diphenyl-N,N'-bis(3-methylphenyl-1,1'-biphenyl)-4,4'-diamine, 2,2-bis(4-di-p-tolylaminophenyl) propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminophenyl ether, 4,4'-bis (diphenylamino)quadriphenyl, N,N,N-tri(p-tolyl)amine, 4-(di-p-tolylamino)-4'-[4-(di-p-tolylamino)styryl]stilbene, 4-N,N-diphenylamino-2-diphenylvinylbenzene, 3-methoxy-4'-N,N-diphenylaminostyrylbenzene, N-phenylcarbazole, etc. are preferable.

As porphyrin compounds, for example, there are porphyrin, copper$^{II}$ 1,10,15,20-tetraphenyl-21H,23H-porphyrin, zinc$^{II}$ 1,10,15,20-tetraphenyl-21H,23H-porphyrin, and 5,10, 15,20-tetrakis(pentafluorophenyl)-21H,23H-porphyrin. As phthalocyanine derivatives, for example, there are metal phthalocyanines such as silicon phthalocyanine oxide, aluminum phthalocyanine chloride, copper tetra(t-butyl)phthalocyanine, etc., metal-free phthalocyanines, dilithium phthalocyanine, copper tetramethylphthalocyanine, copper phthalocyanine (CuPc), chromium phthalocyanine, zinc phthalocyanine, lead phthalocyanine, titanium phthalocyanine oxide, magnesium phthalocyanine, copper octamethylphthalocyanine, etc.

Amongst these, NPB, CuPc, dimers of triphenylamine, trimers of triphenylamine, tetramers of triphenylamine, pentamers of triphenylamine, etc. are more preferable.

When the hole-transporting layer (13) is located on the light-emitting surface side with respect to the light-emitting band, the hole-transporting layer (13) is formed transparent to light to be emitted. Materials transparent to the light when formed into a thin film are suitably selected from the above materials capable of forming the hole-transporting layer (13) and should in general have a transparency of more than 10% to the light.

The hole-transporting layer (13) may be formed with only one kind or a mixture of a plurality of the above mentioned materials. The hole-transporting layer (13) may also have a plurality of layers consisting of identical or different composition(s).

The hole-transporting layer (13) can be formed with these materials by a known film-forming method such as a sputtering method, an ion-plating method, a vacuum-vapor-deposition method, a spin-coating method, an electron-beam vapor-deposition method, a casting method, LB method, etc. on the anode (12).

The thickness of the hole-transporting layer (13) is usually 5 nm-5 μm and preferably 10 nm-90 nm, although this depends upon the materials selected.

<<Phosphorescent Light-Emitting Layer (14)>>

The phosphorescent light-emitting layer (14) is then formed on the hole-transporting layer (13).

The phosphorescent light-emitting layer (14) mainly consists of a phosphorescent host and a phosphorescent dopant. In the phosphorescent light-emitting layer (14), holes injected from the anode (12) and electrons injected from the cathode (19) re-combine to generate excitons, which emit phosphorescence upon returning to the base state. At an ambient temperature, the phosphorescent dopant contained or doped in the phosphorescent light-emitting layer (14) is given energy from the phosphorescent host to be excited to the triplet state and then emit phosphorescence upon transition to the base state. Recombination of holes and electrons at the phosphorescent dopant also excites it to the triplet state following emission of phosphorescence upon transition to the base state.

The phosphorescent dopant contained in the phosphorescent light-emitting layer (14) can suitably be selected from known phosphorescent dopants used in light-emitting layers of organic EL devices. In particular, considering device properties such as whiteness, lifetime, light-emitting efficiency, etc., it is preferred that at least one selected from red phosphorescent dopants and green phosphorescent dopants is used as the phosphorescent dopant.

Red phosphorescent dopants and green phosphorescent dopants may be contained in the same phosphorescent light-emitting layer (14). The phosphorescent light-emitting layer (14) may be phosphorescent light-emitting layers of respective colors consisting of two layers of a phosphorescent light-emitting layer containing a red phosphorescent dopant and a phosphorescent light-emitting layer containing a green phosphorescent dopant. In the latter case, the phosphorescent light-emitting layer containing a red phosphorescent dopant is preferably located nearer to the anode than the phosphorescent light-emitting layer containing a green phosphorescent dopant. Also, the phosphorescent light-emitting layer containing a red phosphorescent dopant preferably forms an island thin film. Herein, "an island thin film" refers to a state where the average thickness of a phosphorescent light-emitting layer containing a phosphorescent dopant is thinner than the thickness of the single molecular film of the phosphorescent host of the phosphorescent light-emitting layer.

The red phosphorescent dopant can be any having a red phosphorescent light-emitting property, and complexes of a metal such as iridium, ruthenium, platinum, osmium, rhenium, palladium, etc. for example are preferable. At least one ligand of these metal complexes preferably has a phenylpyridine skeleton, a bipyridyl skeleton, a porphyrin skeleton, etc. In more detail, iridium bis[2-(2'-benzo[4,5-a]thienyl)pyridinate-N,$C^{3'}$]acetylacetonate (btp2Ir(acac)), platinum 2,3,7,8,12,13,17,18-octaethyl-12H,23H-porphyrin, iridium bis[2-(2'-benzo[4,5-a]thienyl)pyridinate-N,$C^{3'}$], and iridium bis(2-phenylpyridine) acetylacetonate are preferable.

The weight % concentration or doping amount of such red phosphorescent dopants should generally be 0.01 weight %–30 weight %, preferably 0.02 weight %–3 weight %, to the phosphorescent hosts. Within these ranges, whiteness of the present organic EL device can further be improved.

The green phosphorescent dopant can be any having a green phosphorescent light-emitting property, and complexes of a metal such as iridium, ruthenium, platinum, osmium, rhenium, palladium, etc. for example are preferable. At least one ligand of these metal complexes preferably has a phenylpyridine skeleton, a bipyridyl skeleton, a porphyrin skeleton, etc. In more detail, iridium fac-tris(2-phenylpyridine) (Ir(ppy)3), iridium bis(2-phenylpyridinate-N,$C^{2'}$) acetylacetonate, and iridium fac-tris[5-fluoro-2-(5-trifluoromethyl-2-pyridine)phenyl-C,N] are preferable.

The weight % concentration or doping amount of such green phosphorescent dopants should generally be 0.01 weight %–30 weight %, preferably 5 weight %–20 weight %, to the phosphorescent hosts. Within these ranges, whiteness of the present organic EL device can further be improved.

In the above, more efficient emission of red and green phosphorescences can be achieved if the weight % concentration of the red phosphorescent dopants is lower than that of the green phosphorescent dopants.

The phosphorescent host can be any material having a triplet energy gap greater than that of the phosphorescent dopant. As green phosphorescent hosts, for example, there are carbazole derivatives, phenanthroline derivatives, triazole derivatives, metal quinolinolate complexes, etc. In particular, 4,4'-N,N'-dicarbazolebiphenyl (CBP), N,N'-dicarbazolyl-3,5-benzene, poly(9-vinylcarbazole), 4,4',4"-tris(9-carbazolyl)triphenylamine, 4,4'-bis (9-carbazolyl)-2,2'-dimethylbiphenyl, 2,9-dimethyl-4,7-diphenyl-1,10-phenanthroline (BCP), 3-phenyl-4-(1'-naphthyl)-5-phenylcarbazole, etc. are preferable. As red phosphorescent hosts, in addition to the above materials, aluminum tris(8-quinolinolate) (Alq), aluminum bis(2-methyl-8-quinolinolate) 4-(phenylphenolate) (BAlq), etc. are also preferable.

The phosphorescent light-emitting layer (14) can be formed on the hole-transporting layer (13) with these phosphorescent hosts and phosphorescent dopants by known film-forming methods such as sputtering methods, ion-plating methods, vacuum-vapor-deposition methods, spin-coating methods, electron-beam vapor-deposition methods, etc. The thickness of the phosphorescent light-emitting layer (14) is usually 1 nm-50 nm and preferably 2 nm-10 nm, depending upon the selected materials.

<<Non-Light-Emitting Interface Layer (15)>>

The non-light-emitting interface layer (15) is then formed on the phosphorescent light-emitting layer (14). The non-light-emitting interface layer (15) is provided between the phosphorescent light-emitting layer (14) and the fluorescent light-emitting layer (16).

One or more materials with the electron-transporting property but without the light-emitting function or one or more materials with the hole-transporting property but without the light-emitting function can be used in the non-light-emitting interface layer (15). Materials without the light-emitting function are materials which do not emit light upon use in the non-light-emitting interface layer (15) and may be materials essentially having the light-emitting function. Either the material with the electron-transporting property but without the light-emitting function or the material with the hole-transporting property but without the light-emitting function may be used to form the non-light-emitting interface layer (15) or both may be mixed to form the non-light-emitting interface layer (15). In cases of mixing, the component ratio by weight % of the former to the latter is 5:95-95:5, preferably 20:80-80:20, and more preferably 40:60-60:40.

The materials with the electron-transporting property but without the light-emitting function can be any materials with the above properties and for example metal phenolates, metal quinolinolate complexes, triazole derivatives, oxazole derivatives, oxadiazole derivatives, quinoxaline derivatives, quinoline derivatives, pyrrole derivatives, benzopyrrole derivatives, tetraphenylmethane derivatives, pyrazole derivatives, thiazole derivatives, benzothiazole derivatives, thiadiazole derivatives, thionaphthene derivatives, spiro-compounds, imidazole derivatives, benzimidazole derivatives, distyrylbenzene derivatives, silole derivatives, phenanthroline derivatives, triphenylmethane derivatives, etc. can be used. In more detail, BCP, aluminium bis(2-methyl-8-quinolinolate) 4-(phenylphenolate) (BAlq), aluminiumm bis(2-methyl-8-quinolinate) (SAlq), 2,2',2"-(1,3,5-benzenetolyl)-tris[1-phenyl-1H-benzimidazole] (TPBI), 1,3-bis(N-t-butylphenyl)-1,3,4-oxadiazole (OXD-7), 3-phenyl-4-(1'-naphthyl)-5-phenyl-1,2,4-triazole (TAZ), etc. can be used.

The materials with the hole-transporting property but without the light-emitting function can be any materials with the above properties and for example triamine derivatives, tetraamine derivatives, benzidine derivatives, triarylamine derivatives, arylenediamine derivatives, phenylenediamine derivatives, para-phenylenediamine derivatives, meta-phenylenediamine derivatives, 1,1-bis(4-diarylaminophenyl)cyclohexane derivatives, 4,4'-di(diarylamino)biphenyl derivatives, bis[4-(diarylamino)phenyl]methane derivatives, 4,4"-di(diarylamino)terphenyl derivatives, 4,4'''-di(diarylamino) quaterphenyl derivatives, 4,4'-di(diarylamino)diphenyl ether derivatives, 4,4'-di(diarylamino)diphenylsulphane derivatives, bis[4-(diarylamino)phenyl]dimethylmethane derivatives, bis[4-(diarylamino)phenyl]-di(trifluoromethyl)methane derivatives, dimers of triphenylamine, trimers of triphenylamine, tetramers of triphenylamine, pentamers of triphenylamine, etc. can be used. In more detail, NPB, CuPc, 4,4'-bis [N-[4'-[N"-(1-naphthyl)-N"'-phenylamino]biphenyl]-N-phenylamino]-biphenyl (NPTA), N,N'-dicarbazolyl-3,5-benzene (mCP), 4,4'-N,N'-dicarbazolebiphenyl (CBP), etc. can be used.

Further, at least one of the materials with the electron-transporting property but without the light-emitting function in the non-light-emitting interface layer (15) may be the same as at least one of the electron-transporting materials in the electron-transporting layer (17) or the electron-injecting layer (18). Such constructions can also elongate lifetime of the present organic EL device.

Similarly, at least one of the materials with the hole-transporting property but without the light-emitting function in the non-light-emitting interface layer (15) may be the same as at least one of the hosts in the phosphorescent light-emitting layer (14).

The non-light-emitting interface layer (15) can be formed with the above materials by known film-forming methods such as sputtering methods, ion-plating methods, vacuum-vapor-deposition methods, spin-coating methods, electron-beam vapor-deposition methods, etc. on the phosphorescent light-emitting layer (14).

The thickness of the non-light-emitting interface layer (15) is usually 1 nm-14 nm, preferably 2 nm-10 nm, and more preferably 4 nm-8 nm, depending upon selected materials.

<<Fluorescent Light-Emitting Layer (16)>>

The fluorescent light-emitting layer (16) is then formed on the non-light-emitting interface layer (15).

The fluorescent light-emitting layer (16) mainly consists of a fluorescent host and a fluorescent dopant. The fluorescent light-emitting layer (16) transports either or both of holes injected from the anode (12) and electrons injected from the cathode (19), re-combines both, and generates excitons, which emit fluorescence upon return to the base state. The fluorescent host plays the roles of injection and transportation of carriers, whose recombination gives an excited state. The fluorescent host in the excited state transfers the excitation energy to the fluorescent dopant, which emits fluorescence upon returning from the singlet excitation state to the base state at an ambient temperature.

It is preferred that as blue dopants, blue fluorescent dopants rather than blue phosphorescent dopants are used in view of color purity and lifetime.

Such blue fluorescent dopants can be any capable of emitting blue fluorescence and for example distyrylamine derivatives, pyrene derivatives, perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, etc. are preferably used. Amongst these, 4,4'-bis[2-(9-ethylcarbazol-2-yl)vinyl]biphenyl (BCzVBi) is preferable.

The weight % concentration of these blue fluorescent dopants is 0.01 weight %-20 weight %, preferably 0.1 weight %-10 weight %, to the fluorescent hosts.

Within these ranges, blue fluorescent light-emitting intensity on a good balance amongst green phosphorescence from green phosphorescent dopants and red phosphorescence from red phosphorescent dopants can be obtained, thereby achieving a good white light.

The fluorescent hosts used in the fluorescent light-emitting layer (16) are distyrylarylene derivatives, stilbene derivatives, carbazole derivatives, triarylamine derivatives, anthracene derivatives, pyrene derivatives, coronene derivatives, BAlq, etc. Amongst these, 4,4'-bis(2,2'-diphenylvinyl) biphenyl (DPVBi) is preferable.

The fluorescent light-emitting layer (16) may be provided for example by known thin film-forming methods such as vacuum-vapor-deposition methods, spin-coating methods, casting methods, LB methods, etc. on the non-light-emitting interface layer (15).

The thickness of the fluorescent light-emitting layer (16) is usually around 1 nm-100 nm and preferably around 2 n-50 nm, but it is preferred that the thickness is thicker than that of the phosphorescent light-emitting layer (14).

<<Electron-Transporting Layer (17)>>

The electron-transporting layer (17) is then formed on the fluorescent light-emitting layer (16). -biphenyl The electron-transporting layer (17) is provided between the fluorescent light-emitting layer (16) and the electron-injecting layer (18). The electron-transporting layer (17) transports electrons transported from the electron-injecting layer (18) to the fluorescent light-emitting layer (16).

Materials to be used in the electron-transporting layer (17) can be any materials giving the above properties to the electron-transporting layer (17) and for example metal quinolinolate complexes, triazole derivatives, oxazole derivatives, oxadiazole derivatives, quinoxaline derivatives, quinoline derivatives, pyrrole derivatives, benzopyrrole derivatives, tetraphenylmethane derivatives, pyrazole derivatives, thiazole derivatives, benzothiazole derivatives, thiadiazole derivatives, thionaphthene derivatives, spiro-compounds, imidazole derivatives, distyrylbenzene derivatives, phenanthroline derivatives, silole derivatives, triphenylmethane derivatives, benzimidazole derivatives, aluminum tris(8-quinolinolate) (Alq), etc. can be used.

Amongst these, Alq is preferable. The electron-transporting layer (17) may be formed with only one of or a plurality of these materials.

The electron-transporting layer (17) can be formed with the above material(s) by known film-forming methods such as sputtering methods, ion-plating methods, vacuum-vapor-deposition methods, spin-coating methods, electron-beam vapor-deposition methods, etc. on the fluorescent light-emitting layer (16).

The thickness of the electron-transporting layer (17) is usually 1 nm-50 nm and preferably 10 nm-40 nm, depending upon the selected materials.

<<Electron-Injecting Layer (18)>>

The electron-injecting layer (18) is then formed on the electron-transporting layer (17).

The electron-injecting layer (18) is provided between the cathode (19) and the electron-transporting layer (17). The electron-injecting layer (18) forms a cathode-interfacing layer and facilitates injection of electrons from the cathode (19).

Materials to be used in the electron-injecting layer (18) can be any materials giving the above properties to the electron-injecting layer (18) and are alkali (earth) metals, their halides, oxides, peroxides, sulphides, etc., in more detail, alkali metals such as cesium, lithium, etc., alkali earth metals such as calcium, strontium, barium, radium, etc., fluorides such as lithium fluoride, magnesium fluoride, calcium fluoride, strontium fluoride, barium fluoride, etc., oxides such as lithium oxide, etc., for example. Amongst these, lithium fluoride, lithium, and lithium oxide are preferable. The electron-injecting layer (18) may be formed with only one of or a plurality of these materials.

The electron-injecting layer (18) can be prepared with these materials by known film-forming methods such as sputtering methods, ion-plating methods, vacuum-vapor-deposition methods, spin-coating methods, electron-beam vapor-deposition methods, etc. on the electron-transporting layer (17).

The thickness of the electron-injecting layer (18) is usually 0.1 nm-5 nm and preferably 0.3 nm-4 nm, although depending upon selected materials.

<<Cathode (19)>>

The cathode (19) is then formed on the electron-injecting layer (18).

The cathode (19) is an electrode to inject electrons into the electron-injecting layer (18). Metals, alloys, electrically conductive compounds, mixtures thereof, etc. whose work function for example is less than 4.5 eV are used as cathode materials in order to improve electron-injecting efficiency.

Such cathode materials are lithium, sodium, magnesium, gold, silver, copper, aluminum, indium, calcium, tin, ruthenium, titanium, manganese, chromium, yttrium, aluminum-calcium alloys, aluminum-lithium alloys, aluminum-magnesium alloys, magnesium-silver alloys, magnesium-indium alloys, lithium-indium alloys, sodium-potassium alloys, magnesium/copper mixtures, aluminum/aluminum oxide mixtures, etc., for example. The above mentioned anode materials can also be used in the cathode (19). Amongst these materials, aluminum and silver are preferable.

When the cathode (19) is located on the light-emitting surface side with respect to the light-emitting band, the cathode (19) should in general have a transparency of more than 10% to light to be emitted and transparent conductive oxides should be laminated thereon. Upon sputtering conductive oxides in the cathode (19), in order to prevent other light-emitting layers, etc. from being damaged with plasma, it is preferred that a buffering layer comprising copper phthalocyanine, a super-thin film of a metal or alloy, etc. be further provided between the cathode (19) and the electron-injecting layer (18).

When the cathode (19) is used as a light-reflective electrode, materials reflective to light to be emitted are suitably selected from the above materials. In general, metals, alloys, metal compounds, etc. are selected.

The cathode (19) may be formed with only one of or a plurality of the above materials. For example, addition of 5 weight %-10 weight % of silver and/or copper to magnesium can prevent the cathode (19) from oxidation and can improve adhesion of the cathode (19) with the electron-injecting layer (18).

The cathode (19) may consist of a plurality of identical or different composition layers.

The cathode (19) is formed by known thin film-forming methods such as vacuum-vapor-deposition methods, sputtering methods, ionization vapor-deposition methods, ion-plating methods, electron-beam vapor-deposition methods, etc. on the electron-injecting layer (18).

The thickness of the cathode (19) is set to be usually around 5 nm-1 µm, preferably around 5 nm-1,000 nm, especially around 10 nm-500 nm, and most desirably 50 nm-200 nm, depending upon the cathode materials used.

Electric resistance per sheet of the cathode (19) is set preferably to be several hundred $\Omega$/sheet or less.

<Other Layers and Other Dopants>

The present organic EL device may have a layer provided other than the layers shown in FIG. 1. To each layer, known dopants, etc. may further be added or doped.

<Hole-Blocking Layer>

A hole-blocking layer can also be further provided between the fluorescent light-emitting layer (16) and the electron-transporting layer (17). The hole-blocking layer transports electrons transported from the electron-transporting layer (17) to the fluorescent light-emitting layer (16) and blocks holes from the fluorescent light-emitting layer (16). Preferably, the highest level of the valence band of the hole-blocking layer is higher than that of the material adjacent on the anode side. This property allows the fluorescent light-emitting layer (16) to more efficiently emit fluorescence.

Materials used in the hole-blocking layer can be any materials, giving the above properties to the hole-blocking layer, and BCP, BAlq, SAlq, OXD-7, etc. for example can be mentioned and amongst these BCP, BAlq, etc. are preferable. The hole-blocking layer may be formed with a single material or a plurality of materials.

Materials used in the hole-blocking layer may be the same as the electron-transporting materials used in the non-light-emitting interface layer (15).

The hole-blocking layer can be formed with the above materials by known film-forming methods such as sputtering methods, ion-plating methods, vacuum-vapor-deposition methods, spin-coating methods, electron-beam vapor-deposition methods, etc. on the fluorescent light-emitting layer (16).

The hole-blocking layer can be unified with the electron-transporting layer (17) noted above. In this case, for example, a hole-blocking layer material BCP and an electron-transporting layer (17) material Alq are co-vapor-deposited to prepare one unified layer.

Although this depends on the selected materials, the thickness of the hole-blocking layer is usually 1 nm-40 nm, preferably 2 nm-20 nm.

Although not shown in FIG. 1, sealing may be done by one or more additional layers.

This can prevent the present organic EL device from contacting with molecular oxygen and humidity. Since molecular oxygen in particular robs phosphorescent dopants of triplet energies, such sealing is effective.

According to the present invention, organic EL devices can be provided having a good whiteness, light-emitting efficiency, and lifetime at the same time.

EXAMPLES

Hereinafter, examples of the present invention and comparative examples will be described. However, the present invention naturally should not be limited to the following examples.

Example 1

A transparent glass substrate (11), on one of whose surfaces an anode (12) made of an ITO layer of 150 nm thickness had been formed, was washed with an alkali and then with pure water, dried, and then cleaned with UV-ozone.

Onto the anode (12) on the thus washed substrate (11), NPB of the following formula (1) was vapor-deposited in a vacuum vapor deposition apparatus (a carbon crucible, at a vapor deposition speed of 0.1 nm/s, in vacuo around $5.0 \times 10^{-5}$ Pa) to prepare a 40 nm thickness layer to be a hole-transporting layer (13).

(1)

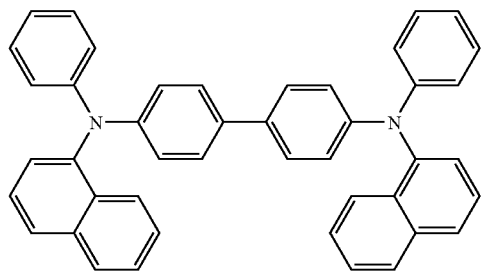

Onto the hole-transporting layer (13), 89.5 weight % of a phosphorescent host CBP of the following formula (2), 0.5 weight % of a red phosphorescent dopant btP2Ir(acac) of the following formula (3), and 10 weight % of a green phosphorescent dopant Ir(ppy)$_3$ of the following formula (4) were co-vapor-deposited in a vacuum vapor deposition apparatus (a carbon crucible, at a vapor deposition speed of 0.1 nm/s, in vacuo around $5.0 \times 10^{-5}$ Pa) to prepare an 8 nm thickness layer to be a phosphorescent light-emitting layer (14).

(2)

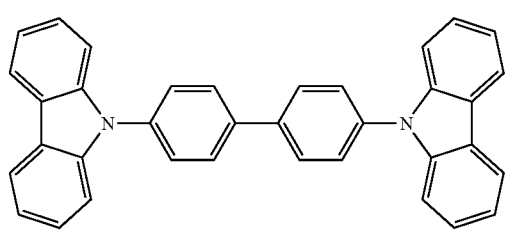

-continued (3)

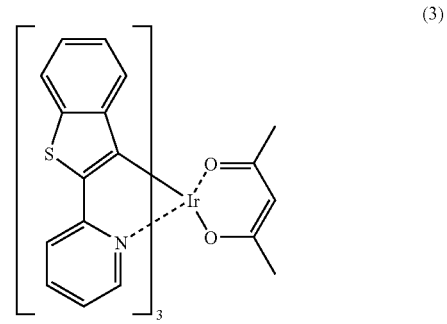

(4)

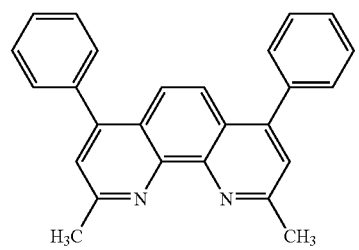

Onto the phosphorescent light-emitting layer (14), 50 weight % of a hole-transporting material NPB of the above formula (1) and 50 weight % of an electron-transporting material BCP of the following formula (5) were co-vapor-deposited in a vacuum vapor deposition apparatus (a carbon crucible, at a vapor deposition speed of 0.1 nm/s, in vacuo around $5.0 \times 10^{-5}$ Pa) to prepare a 4 nm thickness layer to be a non-light-emitting interface layer (15).

(5)

Onto the non-light-emitting interface layer (15), 96 weight % of a fluorescent host DPVBI of the following formula (6) and 4 weight % of a fluorescent dopant BCzVBi of the following formula (7) were co-vapor-deposited in a vacuum vapor deposition apparatus (a carbon crucible, at a vapor deposition speed of 0.1 nm/s, in vacuo around $5.0 \times 10^{-5}$ Pa) to prepare a 20 nm thickness layer to be a fluorescent light-emitting layer (16).

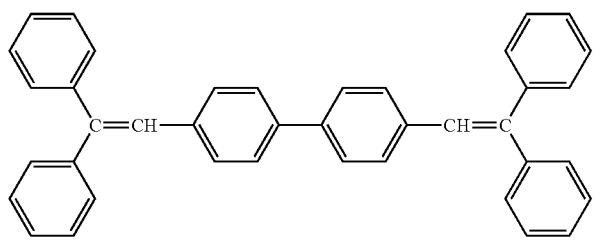

(6)

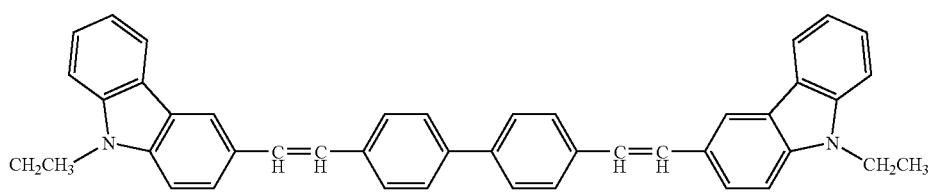

(7)

Onto the fluorescent light-emitting layer (16), BCP of the above formula (5) was vapor-deposited in a vacuum vapor deposition apparatus (a carbon crucible, at a vapor deposition speed of 0.1 nm/s, in vacuo around $5.0 \times 10^{-5}$ Pa) to prepare a 6 nm thickness layer to be a hole-blocking layer.

Onto the hole-blocking layer, Alq of the following formula (8) was vapor-deposited in a vacuum vapor deposition apparatus (a carbon crucible, at a vapor deposition speed of 0.1 nm/s, in vacuo around $5.0 \times 10^{-5}$ Pa) to prepare a 24 nm thickness layer to be an electron-transporting layer (17).

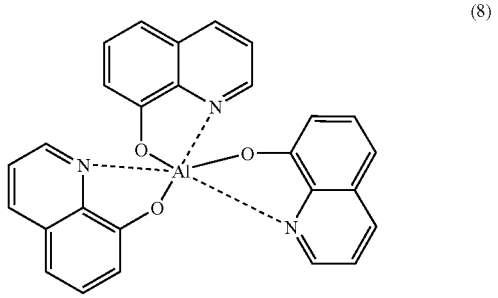

(8)

Onto the electron-transporting layer (17), lithium fluoride (LiF) was vapor-deposited in a vacuum vapor deposition apparatus (a carbon crucible, at a vapor deposition speed of 0.1 nm/s, in vacuo around $5.0 \times 10^{-5}$ Pa) to prepare a 1 nm thickness layer to be an electron-injecting layer (18).

Onto the electron-injecting layer (18), using a tungsten boat (at a vapor deposition speed of 1 nm/s, in vacuo around $5.0 \times 10^{-5}$ Pa), an aluminum (Al) 150 nm thickness layer was prepared to be a cathode (19).

After an organic EL device was finally prepared, the anode (12) and the cathode (19) were connected with a known driving circuit. The electric power efficiency at 1,000 cd/m² brightness as the light-emitting efficiency and whiteness were measured. As lifetime, the half-life of the initial brightness at 2,400 cd/m² was measured, where the half-life of the initial brightness is the duration until the brightness decreases to the half (1,200 cd/m²) with the continuous current for the initial brightness of 2,400 cd/m². The brightness was measured by an apparatus, trade name BM7, manufactured by Topcon K.K. The results obtained are shown in TABLES 1, etc.

Abbreviations of the compounds used in the following examples and comparative examples are summarized below. These abbreviations correspond to the following respective compounds.

| NBP: | 4,4'-bis(N-naphthyl-N-phenylamino)biphenyl |
|---|---|
| CBP: | 4,4'-N,N'-dicarbazol-ylbiphenyl |
| btp2Ir(acac): | iridium bis[2-(2'-benzo[4,5-a]thienyl)pyridinate-N,C³]acetylacetonate |
| Ir(ppy)₃: | iridium fac-tris(2-phenylpyridine) |
| BCP: | 2,9-dimethyl-4,7-diphenyl-1,10-phenanthroline |
| DPVBi: | 4,4'-bis(2,2'-diphenylvinyl)biphenyl |
| BCzVBi: | 4,4'-bis[2-(9-ethylcarbazol-2-yl)vinyl]biphenyl |
| Alq: | aluminum tris(8-quinolinolate) |
| CuPc: | copper phthalocyanine |

Example 2

In example 2, the phosphorescent light-emitting layer (14) as in example 1 was divided into a red phosphorescent light-emitting layer of 1 nm thickness comprising 5 weight % of a red phosphorescent dopant and a green phosphorescent light-emitting layer of 8 nm thickness comprising 10 weight % of a green phosphorescent dopant. As the hosts of both the phosphorescent light-emitting layers, the red phosphorescent dopant, and the green phosphorescent dopant, the same materials as in example 1 were used. Except for the lamination order of the phosphorescent and fluorescent light-emitting layers being altered as shown in TABLE 1, an organic EL device was prepared similar to example 1. In example 2, the thickness of the red phosphorescent light-emitting layer was 1 nm, which was thinner than that of a single-molecular film of the phosphorescent host CBP, so the red phosphorescent light-emitting layer was an island thin film. Similarly to example 1, the electric power efficiency, etc. of the prepared organic EL device were measured. The results obtained are shown in TABLE 1 wherein electric power efficiency and the half-life are shown as relative values with respect to those of example 1.

TABLE 1

| examples | lamination order of phosphorescent & fluorescent light-emitting layers direction from anode side to cathode side | electric power efficiency | chromaticity x | chromaticity y | half-life |
|---|---|---|---|---|---|
| 1 | red & green phosphorescent -> interface layer -> blue fluorescent | 1 | 0.32 | 0.33 | 1 |
| 2 | red phosphorescent -> green phosphorescent -> interface layer -> blue fluorescent | 0.98 | 0.32 | 0.31 | 0.98 |

Example 3

In example 3, an organic EL device was prepared similarly to in example 1 except that the non-light-emitting interface layer was made only of a hole-transporting material CuPc. Similar to example 1, the electric power efficiency, etc. of the prepared organic EL device were measured. The results obtained are shown in TABLE 2 wherein the electric power efficiency and the half-life are shown as relative values with respect to those of example 1.

TABLE 2

| examples | interface layer (weight %) | electric power efficiency | chromaticity x | chromaticity y | half-life |
|---|---|---|---|---|---|
| 1 | NPB:BCP (50:50) | 1 | 0.32 | 0.33 | 1 |
| 3 | CuPc (100) | 0.94 | 0.30 | 0.30 | 0.92 |

Examples 4-10

In examples 4-10, organic EL devices were prepared similarly to example 1 except that the thickness of the non-light-emitting interface layer was converted from 4 nm into 1 nm, 2 nm, 6 nm, 8 nm, 10 nm, 12 nm, and 14 nm, respectively. Similar to example 1, the electric power efficiency, etc. of the prepared organic EL devices were measured. The results obtained are shown in TABLE 3 wherein the electric power efficiency and the half-life are shown as relative values with respect to those of example 1.

TABLE 3

| examples | thickness of interface layer | electric power efficiency | chromaticity x | chromaticity y | half-life |
|---|---|---|---|---|---|
| 1 | 4 nm | 1 | 0.32 | 0.33 | 1 |
| 4 | 1 nm | 0.52 | 0.31 | 0.32 | 0.35 |
| 5 | 2 nm | 0.76 | 0.31 | 0.34 | 0.68 |
| 6 | 6 nm | 0.98 | 0.33 | 0.35 | 1.00 |
| 7 | 8 nm | 0.97 | 0.31 | 0.32 | 0.99 |
| 8 | 10 nm | 0.92 | 0.32 | 0.34 | 0.80 |
| 9 | 12 nm | 0.67 | 0.29 | 0.30 | 0.71 |
| 10 | 14 nm | 0.60 | 0.30 | 0.31 | 0.63 |

Examples 11 and 12

In example 11, an organic EL device was prepared similarly to example 1 except that the hole-blocking layer and the electron-transporting layer were unified into one layer, wherein BCP and Alq were co-vapor-deposited, and in example 12, an organic EL device was prepared similarly to example 1 except that the hole-blocking layer was omitted. Similarly to example 1, the electric power efficiency, etc. of the prepared organic EL devices were measured. The results obtained are shown in TABLE 4 wherein the electric power efficiency and the half-life are shown as relative values with respect to those of example 1.

TABLE 4

| examples | layer constructions different from example 1 | electric power efficiency | chromaticity x | chromaticity y | half-life |
|---|---|---|---|---|---|
| 1 | — | 1 | 0.32 | 0.33 | 1 |
| 11 | hole-blocking and electron-transporting layers unified into one layer | 1.02 | 0.31 | 0.32 | 0.98 |
| 12 | hole-blocking layer omitted | 0.96 | 0.31 | 0.33 | 1.03 |

Comparative Examples 1-3

In each of comparative examples 1-3, an organic EL device was prepared similarly to example 1 except that the lamination order of the phosphorescent and fluorescent light-emitting layers was changed as shown in TABLE 5. With respect to example 1, the lamination order of the phosphorescent and fluorescent light-emitting layers of comparative example 1 was reversed, the non-light-emitting interface layer of comparative example 2 was omitted, and the lamination order of the phosphorescent and fluorescent light-emitting layers of comparative example 3 was reversed and further the non-light-emitting interface layer of comparative example 3 was omitted. That is, comparative example 1 has a construction in which the lamination order of the phosphorescent and fluorescent light-emitting layers was reversed with respect to example 1. Comparative example 2 has a construction in which no non-light-emitting interface layer was provided with respect to example 1. Comparative example 3 has a construction in which no non-light-emitting interface layer was provided and further the lamination order of the phosphorescent and fluorescent light-emitting layers was reversed with respect to example 1. Similarly to example 1, the electric power efficiency, etc. of the prepared organic EL devices were measured. The results obtained are shown in TABLE 5 wherein the electric power efficiency and the half-life are shown as relative values with respect to those of example 1.

TABLE 5

| | phosphorescent & fluorescent light-emitting layers lamination order direction from anode side to cathode side | electric power efficiency | chromaticity x | chromaticity y | half-life |
|---|---|---|---|---|---|
| example 1 | red & green phosphorescent -> interface layer -> blue fluorescent | 1 | 0.32 | 0.33 | 1 |

TABLE 5-continued

| | phosphorescent & fluorescent light-emitting layers lamination order direction from anode side to cathode side | electric power efficiency | chromaticity x | chromaticity y | half-life |
|---|---|---|---|---|---|
| comparative example 1 | blue fluorescent -> interface layer -> red & green phosphorescent | 0.77 | 0.30 | 0.32 | 0.74 |
| comparative example 2 | green & red phosphorescent -> blue fluorescent | 0.33 | 0.29 | 0.29 | 0.19 |
| comparative example 3 | blue fluorescent -> red & green phosphorescent | 0.29 | 0.30 | 0.29 | 0.16 |

As evident from TABLES 1-5, the present organic EL devices of examples 1-12 have the greatly improved electric power efficiency and the half-life compared to comparative examples 2 and 3 wherein no non-light-emitting interface layer was provided between the fluorescent light-emitting layer and the phosphorescent light-emitting layer. Further, the non-light-emitting interface layer provided gave superior whiteness and thus was also found to have a function to adjust chromaticity. On the other hand, comparative example 1 wherein the fluorescent and phosphorescent light-emitting layers were laminated reversely with respect to those of example 1, i.e. the fluorescent light-emitting layer was provided nearer to the anode than the phosphorescent light-emitting layer, was found to have the lower electric power efficiency and the shorter lifetime than example 1.

What is claimed is:

1. An organic EL device, having a light-emitting layer comprising a fluorescent dopant, a light-emitting layer comprising a phosphorescent dopant, and a non-light-emitting interface layer provided between an anode and a cathode wherein the light-emitting layer comprising a fluorescent dopant is provided nearer to the cathode than the light-emitting layer comprising a phosphorescent dopant and wherein the non-light-emitting interface layer is provided between the light-emitting layer comprising a fluorescent dopant and the light-emitting layer comprising a phosphorescent dopant.

2. The organic EL device of claim 1 wherein the fluorescent dopant is a blue fluorescent dopant.

3. The organic EL device of claim 1 wherein the phosphorescent dopant is a red phosphorescent dopant.

4. The organic EL device of claim 1 wherein the phosphorescent dopant is a green phosphorescent dopant.

5. The organic EL device of claim 1 wherein the light-emitting layer comprising a phosphorescent dopant comprises a red phosphorescent dopant and a green phosphorescent dopant.

6. The organic EL device of claim 5 wherein the weight % concentration of the red phosphorescent dopant is lower than that of the green phosphorescent dopant.

7. The organic EL device of claim 1 wherein the light-emitting layer comprising a phosphorescent dopant consists of a light-emitting layer comprising a red phosphorescent dopant and a light-emitting layer comprising a green phosphorescent dopant.

8. The organic EL device of claim 7 wherein the weight % concentration of the red phosphorescent dopant is lower than that of the green phosphorescent dopant.

9. The organic EL device of claim 7 wherein the light-emitting layer comprising a red phosphorescent dopant is provided nearer to the anode than the light-emitting layer comprising a green phosphorescent dopant.

10. The organic EL device of claim 9 wherein the light-emitting layer comprising a red phosphorescent dopant forms an island thin film.

11. The organic EL device of claim 1 wherein the thickness of the light-emitting layer comprising a fluorescent dopant is thicker than that of the light-emitting layer comprising a phosphorescent dopant.

12. The organic EL device of claim 1 wherein a hole-blocking layer is further provided on the cathode side of the light-emitting layer comprising a fluorescent dopant.

* * * * *

UNITED STATES PATENT AND TRADEMARK OFFICE
CERTIFICATE OF CORRECTION

PATENT NO.         : 7,329,984 B2
APPLICATION NO. : 11/301848
DATED                  : February 12, 2008
INVENTOR(S)       : Yoshiaki Nagara et al.

It is certified that error appears in the above-identified patent and that said Letters Patent is hereby corrected as shown below:

Column 1, line 19, please delete "light-emitting efficiency;" and insert therefore -- light-emitting efficiency; and --;

Column 1, lines 21-22, please delete "above properties are relatively good one has been proposed" and insert therefore -- above properties are relatively good, one has been proposed --;

Column 2, line 61, please delete "its anode and cathode wherein" and insert therefore -- its anode and cathode, wherein --;

Column 2, line 64, please delete "dopant and wherein" and insert therefore -- dopant, and wherein --;

Column 3, lines 5-6, please delete "light-emitting layer/cathode" and insert therefore -- light-emitting layer/cathode. --;

Column 3, line 12, please delete "constructions are possible." and insert therefore -- constructions are possible: --;

Column 3, line 16, please delete "(FIG. 1)" and insert therefore -- (FIG. 1); --;

Column 3, lines 20 and 23-24, please delete "layer/cathode" and insert therefore -- layer/cathode; --;

Column 3, line 28, please delete "layer/cathode" and insert therefore -- layer/cathode. --;

Column 3, line 38, please delete "device." and insert therefore -- device: --;

Column 3, line 39, please delete "driving voltage." and insert therefore -- driving voltage; --;

Column 3, line 42, please delete "organic EL devices." and insert therefore -- organic EL devices;--;

Column 3, line 45, please delete "emitting surface." and insert therefore -- emitting surface; --;

UNITED STATES PATENT AND TRADEMARK OFFICE
CERTIFICATE OF CORRECTION

PATENT NO.       : 7,329,984 B2
APPLICATION NO.  : 11/301848
DATED            : February 12, 2008
INVENTOR(S)      : Yoshiaki Nagara et al.

It is certified that error appears in the above-identified patent and that said Letters Patent is hereby corrected as shown below:

Column 5, line 28, please delete "Any can be used selected from" and insert therefore -- Any can be selected from --;

Column 6, line 14, please delete "(4′′′-tert-butylbiphen-4′′′-yl)amino]" and insert therefore -- 4′′′-tert-butylbiphen-4′′′′-yl)amino] --;

Column 9, lines 12-13, please delete "aluminiumm" and insert therefore -- aluminium$^{III}$ --;

Column 9, line 44, please delete "elongate lifetime of" and insert therefore -- elongate the lifetime of --;

Column 9, line 67, please delete "either or both of" and insert therefore -- either or both --;

Column 10, line 49, please delete "(16). -biphenyl" and insert therefore -- (16). --;

Column 14, line 60, please delete "fluorescent host DPVBI" and insert therefore -- fluorescent host DPVBi --;

Column 15, line 63, please delete "decreases to the half" and insert therefore -- decreases to half -- ; and Column 17, line 20, please delete "to in example 1" and insert therefore -- to example 1 --.

Signed and Sealed this

Thirteenth Day of October, 2009

David J. Kappos
*Director of the United States Patent and Trademark Office*